(12) United States Patent
Seaberg et al.

(10) Patent No.: US 10,892,758 B1
(45) Date of Patent: Jan. 12, 2021

(54) TRACKING VOLTAGE REFERENCE FOR SINGLE ENDED RECEIVER

(71) Applicant: NXP B.V., Eindhoven (NL)

(72) Inventors: Charles Eric Seaberg, Austin, TX (US); Khoi Mai, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/038,702

(22) Filed: Sep. 30, 2020

(51) Int. Cl.
*H03K 19/017* (2006.01)
*H04L 25/02* (2006.01)
*H03K 17/16* (2006.01)
*G05F 3/24* (2006.01)

(52) U.S. Cl.
CPC ....... *H03K 19/01721* (2013.01); *G05F 3/247* (2013.01); *H03K 17/16* (2013.01); *H04L 25/028* (2013.01)

(58) Field of Classification Search
CPC ............. H03K 19/01721; H03K 19/01; H03K 19/017; H03K 19/01707; H03K 19/01728; H03K 19/01742; H03K 17/16; H03K 17/161; H03K 17/165; G05F 3/247; H04L 25/028; H04L 25/0284
USPC .......................................................... 327/543
See application file for complete search history.

(56) References Cited

U.S. PATENT DOCUMENTS

| | | | |
|---|---|---|---|
| 6,690,740 B1 * | 2/2004 | Mattisson | H04L 27/142 375/295 |
| 8,665,007 B2 * | 3/2014 | Ochoa | H01L 27/0285 327/541 |
| 9,845,072 B1 * | 12/2017 | Carter | G01V 3/081 |
| 2004/0043739 A1 * | 3/2004 | Jordanger | H04B 3/30 455/302 |
| 2010/0021176 A1 * | 1/2010 | Holcombe | H04B 10/1143 398/115 |

OTHER PUBLICATIONS

Kim et al., "A Design of Transceiver for 13.56 MHz RFID Reader using the Peak Detector with Automatic Reference Voltage Generator and Voltage Limiter," 2010 International SoC Design Conference, Seoul, 2010, pp. 287-289.
STMicroelectronics, "Receiving S/PDIF audio stream with the STM32F4/F7/H7 Series," downloaded from the internet https://www.st.com/resource/en/application_note/dm00431633-receiving-spdif-audio-stream-with-the-stm32f4f7h7-series-stmicroelectronics.pdf, Sep. 4, 2020, 26 pages.
Park et al., "The Chip: Peak Detectors for Multistandard Wireless Receivers," IEEE Circuits & Devices Magazine, Nov./Dec. 2006, 4 pages.

* cited by examiner

*Primary Examiner* — Tomi Skibinski
(74) *Attorney, Agent, or Firm* — Mary Jo Bertani

(57) ABSTRACT

A receiver includes an input node coupled to receive an analog signal, a first switch coupled between the input node and a first node, a second switch coupled between the input node and a second node, a first resistive element coupled between the first node and a reference node, a second resistive element coupled between the second node and the reference node, a first capacitive element coupled to the first node, and a second capacitive element coupled to the second node. The receiver also includes a comparator having a first input coupled to the input node to receive the analog signal, and a second input coupled to the reference node to receive a reference voltage, wherein an output of the comparator controls the first and second switches.

20 Claims, 2 Drawing Sheets

TRACKING VOLTAGE REFERENCE FOR SINGLE ENDED RECEIVER

BACKGROUND

Field

This disclosure relates generally to integrated circuit devices, and more specifically, to tracking voltage reference for single ended receivers.

Related Art

In a typical single-ended alternating current (AC)-coupled communication receiver, a circuit is used at the receiving end to set the termination voltage and a direct current (DC) level is replicated and used as a reference voltage for the comparator. However, if the start or end of the data transmission is different than the DC balance of the line, the termination voltage and thus the reference voltage will not be centered around the input signal until the line reaches its DC balanced point or steady state. In some communication protocols, such as common-mode eARC communication channel, the time required for the line to settle far exceeds the specified start-up window.

A typical circuit that extracts the DC component of a switching signal uses an RC filter. However, there is a direct tradeoff between the startup time and the ripple due to the switching. The faster the startup time the higher the ripple which translates directly to the higher receiver jitter. The filter also requires a representative density of positive and negative pulses to accurately render an average.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of a communication receiver and method for operating the communication receiver are provided that detect the peak high and low pulses and average the peak detected values to generate a reference voltage for a comparator. The comparator generates the output recovered logic levels. Embodiments of the invention disclosed herein thus allow for reasonable reference values with fewer input data values than other known solutions. An averaging portion of the receiver also acts as second RC filter that controls the relaxation of the peak detection circuit, resulting in lower ripple. Relaxation of the peak detection circuit allows the reference point to track the DC component as the DC component settles during operation of the communication receiver.

Figure 1:
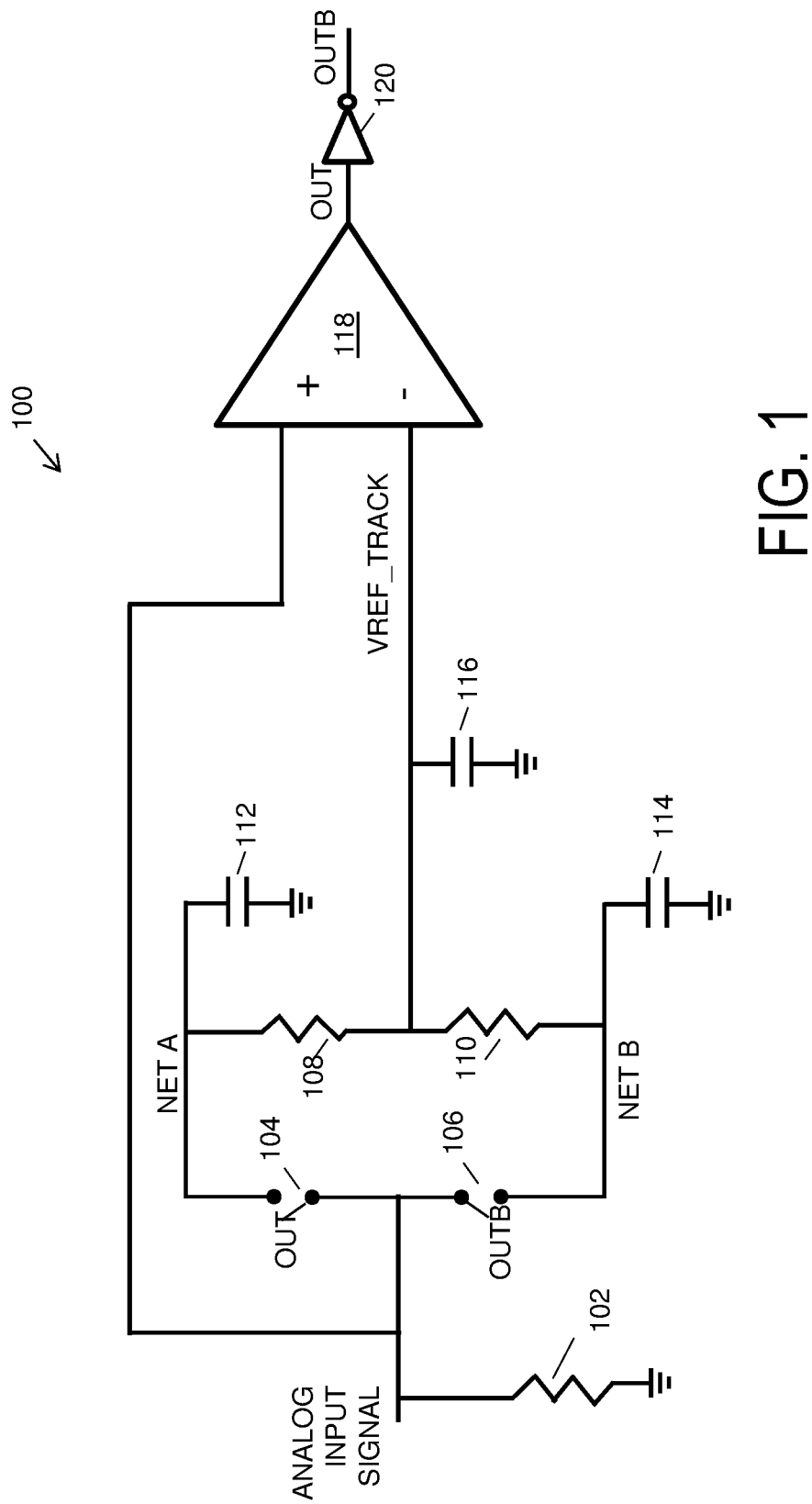
FIG. 1 illustrates a schematic diagram of an integrated circuit device for a communication receiver with fast startup tracking voltage reference in accordance with selected embodiments of the present invention.

FIG. 1 illustrates a schematic diagram of communication receiver 100 in accordance with embodiments of the present invention that includes termination resistive element 102, switches 104, 106, averaging resistive elements 108, 110, capacitive elements 112, 114, 116, comparator 118, and inverter 120. An analog communication signal is coupled as an input to a first terminal of termination resistive element 102, a non-inverting input to comparator 118, and to first terminals of switches 104, 106. Terminating resistive element 102 includes a second terminal coupled to ground or other suitable supply voltage. Switch 104 includes a control terminal that is coupled to an OUT signal that is generated at the output of comparator 118. The OUT signal is also provided as input to inverter 120. In addition to the first terminal coupled to the analog input signal, switch 104 includes a second terminal coupled to a first terminal of capacitive element 112. A second terminal of capacitive element 112 is coupled to ground or other suitable supply voltage. Switch 106 includes a control terminal that is coupled to the complement of the OUT signal (shown as OUTB), which is generated at the output of inverter 120. In addition to the first terminal coupled to the analog input signal, switch 106 includes a second terminal coupled to a first terminal of capacitive element 114. A second terminal of capacitive element 114 is coupled to ground or other suitable supply voltage. In some implementations, resistive elements 108, 110 have matching resistances, and capacitive elements 112, 114 have matching capacitances.

Resistive element 108 includes a first terminal coupled between the second terminal of switch 104 and the first terminal of capacitive element 112. The conductor coupling the second terminal of switch 104, the first terminal of resistive element 108 and the first terminal of capacitive element 112 is referred to as Net A. A second terminal of resistive element 108 is coupled to a first terminal of resistive element 110. A second terminal of resistive element 110 is coupled between the second terminal of switch 106 and a first terminal of capacitive element 114. A second terminal of capacitive element 114 is coupled to ground or other suitable supply voltage. A conductor coupling the second terminal of switch 106, the second terminal of resistive element 110 and the first terminal of capacitive element 114 is referred to as Net B.

In addition to a non-inverting input coupled to the analog input signal, comparator 118 includes an inverting input coupled between the second terminal of resistive element 108 and the first terminal of resistive element 110.

Capacitive element 116 includes a first terminal coupled between the second terminal of resistive element 108 and the first terminal of resistive element 110, and the inverting input of comparator 118. A second terminal of capacitive element 116 is coupled to ground or other suitable supply voltage.

Switches 104, 106 are controlled by the signals OUT and OUTB generated by comparator 118 and inverter 120, respectively. Analog input signal is an is a modulated and encoded binary data signal that is suitably AC coupled to receiver 100 to facilitate data transmission and yet isolate the DC levels of the channel from the DC levels of receiver 100. Switches 104, 106 can be implemented with MOSFET transistors that have resistance that is based on the drain-source voltage and the drain current. When switches 104, 106 are implemented with transistors, each transistor has a current electrode coupled to the analog input signal and another current electrode coupled to NET A or NET B that provide data signals to NET A and NET B. During operation, when the analog input signal is positive, the OUT signal is asserted, switch 104 is closed, and switch 106 is open. Net A tracks the high peak of the analog input signal while Net B is in a relaxation phase. The resistance of switch 104 and capacitive element 112 are selected to provide the desired response time of the VREF_TRACK signal that is provided to inverting input of comparator 118. Resistive elements 108 and 110 and capacitive elements 112, 114 set the response characteristics of the relaxation phase after the peak value is reached. When the analog input signal is negative, the OUTB signal is asserted, switch 106 is closed and switch 104 is open. Net B tracks the low peak of the analog input signal while Net A is in a relaxation phase. The resistance of switch 106 and capacitive element 114 are selected to provide the desired response time of the VREF_TRACK signal that is provided to inverting input of comparator 118. Resistive elements 108 and 110 and capacitive elements 112, 114 set the response characteristics of the relaxation phase after the peak value of the OUTB signal is reached. VREF_TRACK signal is a weighted average of the positive and negative peaks of the analog input signal, subject to the chosen track and relaxation time constants, and allows the recovery of the transmitted waveform.

Figure 2:
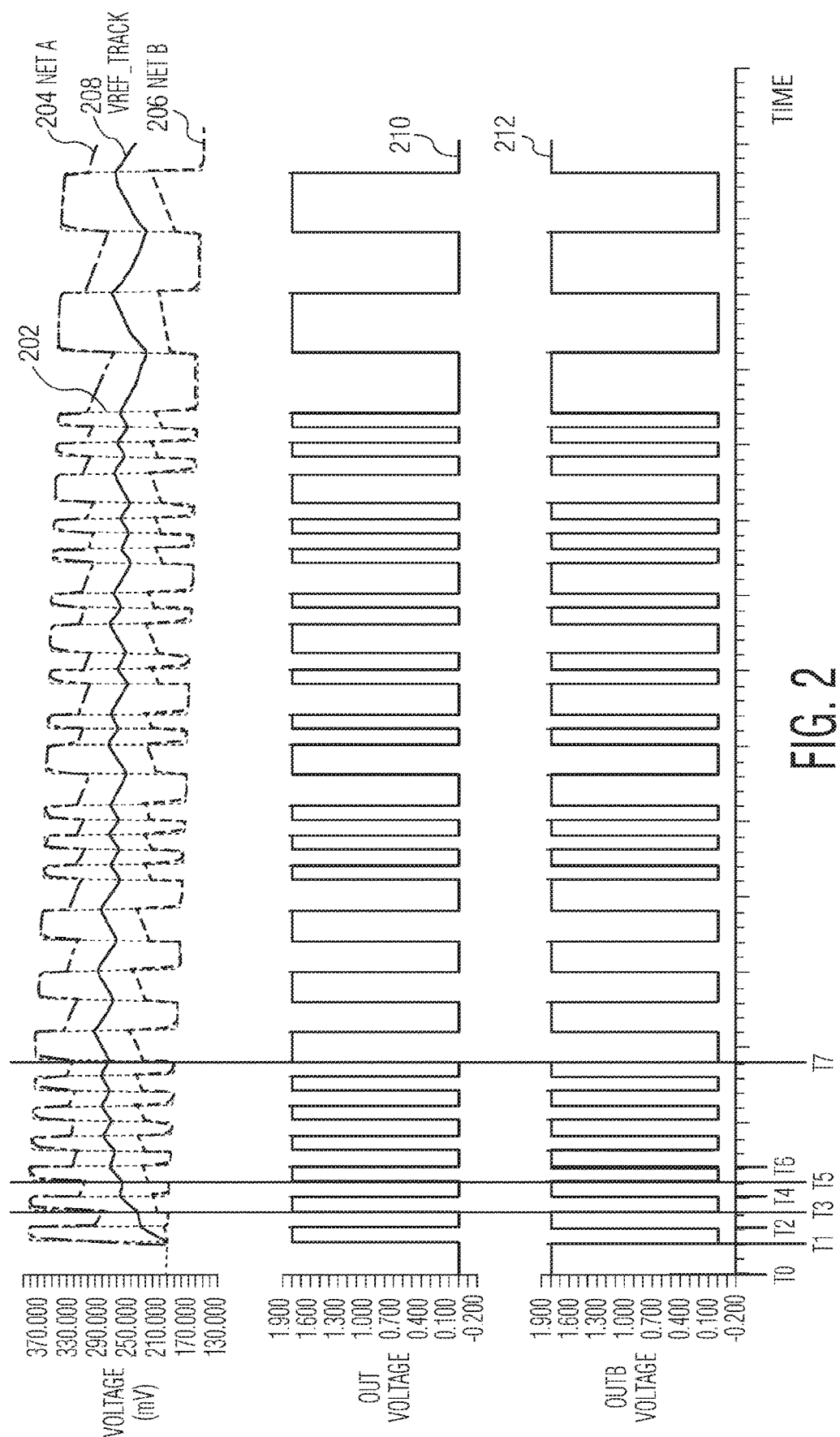
FIG. 2 illustrates examples of voltage versus time graphs for various signals shown in the communication receiver of FIG. 1.

Referring to FIGS. 1 and 2, FIG. 2 illustrates examples of voltage versus time graphs for various signals used in the communication receiver 100 of FIG. 1. Analog input signal 202 is a binary encoded input analog signal that can have varying amplitude/logic levels and DC offset over time. For purposes of example only, analog input signal 202 has a swing of 200 mV with a starting voltage of 200 mV set by the termination. Other suitable voltage levels and swing amplitude for analog input signal 202 can be used, however. Analog input signal 202 is encoded so that logic high and logic low are fairly constant relative to the switching rate of the data and so remains at upper and lower peak values for varying amounts of time. At the start of the time history, at time T0, analog input signal 202, NET A signal, NET B signal, and VREF_TRACK signal are at the lower peak voltage for purposes this example only and do not necessarily start at this voltage. OUT signal 210 is de-asserted, and OUTB signal 212 is asserted. At time T1, analog input signal 202 goes from the lower peak voltage to the upper peak voltage. OUT signal 210 is asserted, OUTB signal 210 is de-asserted, and NET A signal 204 follows analog input signal 202 closely to the upper peak value of analog input signal 202 while NET B signal 206 remains at or close to the lower peak voltage. NET A signal 204 has a very slight delay reaching the upper peak voltage, as shown by a small space between NET A signal 204 and analog input signal 202 at the upper leading edge of the pulse. The delay is determined by the time constant of the resistance of switch 104 and capacitive element 112. VREF_TRACK signal 208 starts increasing from the lower peak voltage toward a midpoint between the upper and lower peak voltages of approximately 300 millivolts at time T1.

At time T2, analog input signal 202 goes from the upper peak voltage to the lower peak voltage. NET A signal 204 follows to approximately midway between the upper and lower peak voltages, for example, to 300 mV, and decays or relaxes to a slightly lower voltage, for example, to 290 mV, between times T2 and T3. The amount of decay or relaxation is determined by resistive element 108 and capacitive element 112 and the delay in non-ideal comparator 118. Until switch 104 is switched off, NET A follows the analog input signal down with the fast time constant set by the resistance of switch 104. After switch 104 is switched off, then the decay is determined by resistive element 108 and capacitive element 112. One can thus appreciate the ability to adjust response and variability of the waveforms depending on component availability and choice. FIG. 2 is one example of the spectrum of responses that could be chosen. NET B signal 206 barely starts to increase between times T1 and T2 and returns to the low peak voltage between times T2 and T3. VREF_TRACK signal 208 continues to increase to a value between the upper and lower peak voltages from time T2 to T3.

At time T3, analog input signal 202 goes from the lower peak voltage to the upper peak voltage. NET A signal 204 again closely follows analog input signal 202 to the upper peak value of analog input signal 202 while NET B signal 206 is at or close to the lower peak voltage. NET A signal 204 has a very slight delay reaching the upper peak voltage, as shown by a small space between NET A signal 204 and analog input signal 202 at the upper leading edge of the pulse. VREF_TRACK signal 208 continues increasing from approximately 235 mV to 265 mV between times T3 and T4. NET A signal 204 follows analog input signal 202 to less than midway (for example, 320 mV) between the upper and lower peak voltages and decays slowly to a slightly lower voltage (for example, 310 mV) between times T3 and T4. NET B signal 206 increases from the lower peak voltage and rises slightly between times T3 and T4. For example, NET B signal 206 rises from 210 to 220 mV during a relaxation phase based on resistive element 110 and capacitive element 114. VREF_TRACK signal 208 continues to increase to a value between the upper and lower peak voltages, for example, from approximately 240 to 265 mV, from time T3 to T4.

Analog input signal 202 transitions from upper to lower peak voltage at time T4. NET A signal 204 follows analog input signal 202 to a point between the upper and lower peak voltages, for example, to 320 mV, and decays or relaxes to a slightly lower voltage, for example, to 310 mV, between times T4 and T5. The amount of decay or relaxation is determined by resistive element 108 and capacitive element 112. NET B signal 206 decreases to the lower peak voltage at time T4 and remains at the lower peak voltage between times T4 and T5. VREF_TRACK signal 208 decreases slightly between time T4 and time T5.

Analog input signal 202 transitions from lower to upper peak voltage at time T5. NET A signal 204 follows analog input signal 202 to the upper peak voltage and decays slowly to a slightly lower voltage (for example, decays from 330 to 325 mV) between times T6 and T7. NET B signal 206 increases from the lower peak value at time T5 to an intermediate voltage, for example, 220 mV at time T5. Between times T5 and T6, NET B signal 206 increases slightly during a relaxation phase between times T5 to T6. For example, NET B signal 206 rises from 220 to 230 mV during the relaxation phase based on resistive element 110 and capacitive element 114. VREF_TRACK signal 208 increases to a value between the upper and lower peak voltages, for example, from approximately 260 to 280 mV, from time T5 to T6.

For the remaining time, analog input signal 202 continues to vary between upper and lower peak voltages. When analog input signal 202 increases toward the upper peak voltage, NET A 204 signal follows analog input signal 202 to the upper peak voltage while NET B signal 206 increases to an intermediate value above the lower peak value but below VREF_TRACK signal 208. During relaxation periods, while analog input signal 202 and NET A signal 204 remain at the upper peak voltage, NET B signal 206 increases slightly but remains well below VREF_TRACK signal 208. When analog input signal 202 transitions from the upper peak voltage to the lower peak voltage, NET A 204 signal follows analog input signal 202 to an intermediate value below the upper peak value but above VREF_TRACK signal 208 while NET B signal 206 decreases with analog input signal to the lower peak value. During relaxation periods, while analog input signal 202 and NET B signal 204 remain at the lower peak voltage, NET A signal 206 decreases slightly but remains well above VREF_TRACK signal 208. VREF_TRACK signal 208 increases to a modest extent when analog input signal 202 and NET A signal 204 are at the upper peak voltage, and decreases a similar amount when analog input signal 202 and NET B signal 206 are at the lower peak voltage. Note that VREF_TRACK signal 208 achieves the majority of the settling by time T7.

VREF_TRACK signal 202 gradually increases, in a shallow sawtooth or ripple waveform, to an intermediate average value as receiver begins operating at time T1. After the first several cycles of analog input signal 202, VREF_TRACE signal 202 continues with a sawtooth or ripple pattern alternating slightly above and below an average reference track voltage. The upper and lower peak values are shown as decreasing over time because the VREF_TRACK signal 202 is not yet charged to its DC balance point, which is determined by the swing and the initial or termination voltage. As an example, with the termination voltage of 200 mV and the swing amplitude of 200 mV, when the line reaches its DC balance, the high level will settle out at 300 mV and the low level will settle out at 100 mV. The startup time can be adjusted to meet specified requirements by adjusting the resistance of switches 104, 106 and the value of capacitive elements 112, 114. In addition, the amount of ripple can be controlled be adjusting the values of resistive elements 108, 110 and capacitive elements 112, 114, 116. Receiver 100 thus satisfies two competing requirements, with the ability to decouple the peak tracking and the relaxation phase to achieve fast start up time and low ripple. Receiver 100 can also achieve greater noise margins for a specified startup time due to the damping of the amount of ripple in the VREF_TRACK signal 208, as both the upper and lower peak voltages are used to generate the VREF_TRACK signal 208.

By now it should be appreciated that in some embodiments there has been provided a receiver that can comprise an input node coupled to receive an analog signal, a first switch coupled between the input node and a first node (NET A), a second switch coupled between the input node and a second node (NET B), a first resistive element (108) coupled between the first node and a reference node, a second resistive element (110) coupled between the second node and the reference node, a first capacitive element (112) coupled to the first node, a second capacitive element (114) coupled to the second node, and a comparator having a first input (+) coupled to the input node to receive the analog signal, a second input (−) coupled to the reference node to receive a reference voltage, wherein an output (OUT (which is also used to produce OUTB)) of the comparator controls the first and second switches.

In another aspect, the receiver can further comprise a third capacitive element (C2) coupled to the reference node.

In another aspect, the first switch can be configured to be conductive between the input node and the first node when the output of the comparator has a first logic state and non-conductive between the input node and the first node when the output of the comparator has a second logic state, different from the first logic state.

In another aspect, the second switch can be configured to be conductive between the input node and the first node when the output of the comparator has the second logic state and non-conductive between the input node and the first node when the output of the comparator has the first logic state.

In another aspect, the output of the comparator controls opening and closing of the first switch and an inverse of the output of the comparator controls opening and closing of the second switch.

In another aspect, when the output of the comparator has a first logic state, the first switch is closed, and when the output of the comparator has a second logic state, opposite the first logic state, the first switch is open; and when the inverse of the output of the comparator has the first logic state, the second switch is closed, and when the inverse of the output of the comparator has the second logic state, the second switch is open.

In another aspect, the receiver can further comprise an inverter having an input configured to receive the output of the comparator, and an output configured to provide the inverse of the output of the comparator.

In another aspect, the first resistive element and the second resistive element have matching resistances, and the first capacitive element and the second capacitive element have matching capacitances.

In another aspect, the first switch can comprise a first transistor having a first current electrode coupled to the input node, a second current electrode coupled to the first node, and a control electrode coupled to the output of the comparator, and the second switch comprises a second transistor having a first current electrode coupled to the input node, a second current electrode coupled to the second node, and a control electrode coupled to receive an inverse of the output of the comparator.

In another aspect, the receiver can further comprise an inverter having an input configured to receive the output of the comparator, and an output configured to provide the inverse of the output of the comparator, wherein the control electrode of the second transistor is coupled to the output of the inverter.

In other embodiments, a receiver can comprise an input node coupled to receive an analog signal, and a first switch including a control terminal, a first data terminal coupled to the input node, a second data terminal coupled to a first node (NET A). A second switch includes a control terminal, a first data terminal coupled to the input node, and a second data terminal coupled to a second node (NET B). A first resistive element can be coupled between the first node and a reference node. A second resistive element can be coupled between the second node and the reference node. A first capacitive element can be coupled to the first node. A second capacitive element can be coupled to the second node. A third capacitive element can be coupled to the reference node. A comparator includes a first input (+) coupled to the input node to receive the analog signal, a second input (−) coupled to the reference node to receive a reference voltage. An output (OUT) of the comparator is coupled the control terminal of the first switch, and an inverse of the output (OUTB) of the comparator is coupled to the control terminal of the second switch.

In another aspect, the first switch can comprise a first transistor in which a first current electrode of the first transistor is characterized as the first data terminal of the first switch, a second current electrode of the first transistor is characterized as the second data terminal of the first switch, and a control electrode of the first transistor is characterized as the control terminal of the first switch. The second switch comprises a second transistor in which a first current electrode of the second transistor is characterized as the first data terminal of the second switch, a second current electrode of the second transistor is characterized as the second data terminal of the second switch, and a control electrode of the second transistor is characterized as the control terminal of the second switch.

In another aspect, the first input of the comparator can be an inverting input of the comparator and the second input of the comparator can be a non-inverting input of the comparator.

In another aspect, the receiver can further comprise an inverter having an input coupled to the output of the comparator and an output coupled to provide the inverse of the output of the comparator.

In another aspect, the first and second resistive elements each has a same resistance value, and the first and second capacitive elements each has a same capacitance value.

In further embodiments, a method implemented using a receiver can comprise receiving an analog input signal, and comparing a voltage of the analog input signal to a tracking reference voltage produced at a reference node. While the voltage of the analog input signal is less than the tracking reference voltage, the input analog signal can be provided to a first input of a first resistive element-capacitive element (RC) circuit (104, 112) such that a first node (NET A) of the first RC circuit tracks the analog input signal, wherein a first output of the first RC circuit is coupled to the reference node. While the voltage of the analog input signal is greater than the tracking reference voltage, the input analog signal is provided to a second input node (NET B) of a second RC circuit (106, 114) such that the second input tracks the analog input signal, wherein a second output of the second RC circuit is coupled to the reference node.

In another aspect, while the voltage of the analog input signal is less than the tracking reference voltage, the first RC circuit comprises a first resistance corresponding to a closed first switch (104) coupled to transmit the analog input signal to the first node (NET A), and a first capacitive element (112) coupled between the first node and ground. The second node is coupled to a third RC circuit (110/116). While the voltage of the analog input signal is greater than the tracking reference voltage, the second RC circuit comprises a second resistance corresponding to a second closed switch (106) coupled to transmit the analog input signal to the second node (NET B), and a second capacitive element (114) coupled between the second node and ground, and the first node is coupled to a fourth RC circuit (108/116).

In another aspect, while the voltage of the analog input signal is less than the tracking reference voltage: the first node (NET A) is in a tracking phase, and the second node (NET B) is in a relaxation phase. While the voltage of the analog input signal is greater than the tracking reference voltage: the first node (NET A) is in the relaxation phase and the second node (NET B) is in the tracking phase. The tracking reference voltage tracks an average between a voltage at the first node and a voltage at the second node.

In another aspect, the third RC circuit comprises a third resistance (110) coupled between the second node (NET B) and the reference node, and a third capacitive element (116) coupled between the reference node and ground. The fourth RC circuit comprises a fourth resistance (108) coupled between the first node (NET A) and the reference node, and the third capacitive element (116).

In another aspect, the first and second capacitive elements having matching capacitances, and the third and fourth resistances have matching resistances.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A receiver, comprising:
   an input node coupled to receive an analog signal;
   a first switch coupled between the input node and a first node;
   a second switch coupled between the input node and a second node;
   a first resistive element coupled between the first node and a reference node;
   a second resistive element coupled between the second node and the reference node;
   a first capacitive element coupled to the first node;
   a second capacitive element coupled to the second node; and
   a comparator having a first input coupled to the input node to receive the analog signal, a second input coupled to the reference node to receive a reference voltage, wherein an output of the comparator controls the first and second switches.
2. The receiver of claim 1, further comprising a third capacitive element coupled to the reference node.

3. The receiver of claim 1, wherein the first switch is configured to be conductive between the input node and the first node when the output of the comparator has a first logic state and non-conductive between the input node and the first node when the output of the comparator has a second logic state, different from the first logic state.

4. The receiver of claim 3, wherein the second switch is configured to be conductive between the input node and the first node when the output of the comparator has the second logic state and non-conductive between the input node and the first node when the output of the comparator has the first logic state.

5. The receiver of claim 1, wherein the output of the comparator controls opening and closing of the first switch and an inverse of the output of the comparator controls opening and closing of the second switch.

6. The receiver of claim 5, wherein:
when the output of the comparator has a first logic state, the first switch is closed, and when the output of the comparator has a second logic state, opposite the first logic state, the first switch is open; and
when the inverse of the output of the comparator has the first logic state, the second switch is closed, and when the inverse of the output of the comparator has the second logic state, the second switch is open.

7. The receiver of claim 5, further comprising:
an inverter having an input configured to receive the output of the comparator, and an output configured to provide the inverse of the output of the comparator.

8. The receiver of claim 1, wherein the first resistive element and the second resistive element have matching resistances, and the first capacitive element and the second capacitive element have matching capacitances.

9. The receiver of claim 1, wherein the first switch comprises a first transistor having a first current electrode coupled to the input node, a second current electrode coupled to the first node, and a control electrode coupled to the output of the comparator, and the second switch comprises a second transistor having a first current electrode coupled to the input node, a second current electrode coupled to the second node, and a control electrode coupled to receive an inverse of the output of the comparator.

10. The receiver of claim 9, further comprising:
an inverter having an input configured to receive the output of the comparator, and an output configured to provide the inverse of the output of the comparator, wherein the control electrode of the second transistor is coupled to the output of the inverter.

11. A receiver, comprising:
an input node coupled to receive an analog signal;
a first switch having a control terminal, a first data terminal coupled to the input node, a second data terminal coupled to a first node;
a second switch having a control terminal, a first data terminal coupled to the input node, and a second data terminal coupled to a second node;
a first resistive element coupled between the first node and a reference node;
a second resistive element coupled between the second node and the reference node;
a first capacitive element coupled to the first node;
a second capacitive element coupled to the second node;
a third capacitive element coupled to the reference node; and
a comparator having a first input coupled to the input node to receive the analog signal, a second input coupled to the reference node to receive a reference voltage, wherein an output of the comparator is coupled the control terminal of the first switch, and an inverse of the output of the comparator is coupled to the control terminal of the second switch.

12. The receiver of claim 11, wherein:
the first switch comprises a first transistor in which a first current electrode of the first transistor is characterized as the first data terminal of the first switch, a second current electrode of the first transistor is characterized as the second data terminal of the first switch, and a control electrode of the first transistor is characterized as the control terminal of the first switch; and
the second switch comprises a second transistor in which a first current electrode of the second transistor is characterized as the first data terminal of the second switch, a second current electrode of the second transistor is characterized as the second data terminal of the second switch, and a control electrode of the second transistor is characterized as the control terminal of the second switch.

13. The receiver of claim 11, wherein the first input of the comparator is an inverting input of the comparator and the second input of the comparator is a non-inverting input of the comparator.

14. The receiver of claim 11, further comprising:
an inverter having an input coupled to the output of the comparator and an output coupled to provide the inverse of the output of the comparator.

15. The receiver of claim 11, wherein the first and second resistive elements each has a same resistance value, and the first and second capacitive elements each has a same capacitance value.

16. In a receiver, a method comprising:
receiving an analog input signal;
comparing a voltage of the analog input signal to a tracking reference voltage produced at a reference node;
while the voltage of the analog input signal is less than the tracking reference voltage, providing the input analog signal to a first input of a first resistive element-capacitive element (RC) circuit such that a first node of the first RC circuit tracks the analog input signal, wherein a first output of the first RC circuit is coupled to the reference node; and
while the voltage of the analog input signal is greater than the tracking reference voltage, providing the input analog signal to a second input node of a second RC circuit such that the second input tracks the analog input signal, wherein a second output of the second RC circuit is coupled to the reference node.

17. The method of claim 16, wherein:
while the voltage of the analog input signal is less than the tracking reference voltage:
the first RC circuit comprises a first resistance corresponding to a closed first switch coupled to transmit the analog input signal to the first node, and a first capacitive element coupled between the first node and ground, and
the second node is coupled to a third RC circuit; and
while the voltage of the analog input signal is greater than the tracking reference voltage:
the second RC circuit comprises a second resistance corresponding to a second closed switch coupled to transmit the analog input signal to the second node, and a second capacitive element coupled between the second node and ground, and
the first node is coupled to a fourth RC circuit.

18. The method of claim 17, wherein:
while the voltage of the analog input signal is less than the tracking reference voltage: the first node is in a tracking phase, and the second node is in a relaxation phase;
while the voltage of the analog input signal is greater than the tracking reference voltage: the first node is in the relaxation phase and the second node is in the tracking phase; and
the tracking reference voltage tracks an average between a voltage at the first node and a voltage at the second node.

19. The method of claim 17, wherein:
the third RC circuit comprises a third resistance coupled between the second node and the reference node, and a third capacitive element coupled between the reference node and ground; and
the fourth RC circuit comprises a fourth resistance coupled between the first node and the reference node, and the third capacitive element.

20. The method of claim 19, wherein the first and second capacitive elements having matching capacitances, and the third and fourth resistances have matching resistances.

\* \* \* \* \*